(12) United States Patent
Shtrahman et al.

(10) Patent No.: US 6,402,837 B1
(45) Date of Patent: Jun. 11, 2002

(54) APPARATUS AND METHOD OF PREPARATION FOR AUTOMATED HIGH OUTPUT BIOPOLYMER CRYSTALLIZATION VIA VAPOR DIFFUSION SITTING DROP AND MICRO-BATCH TECHNIQUES

(76) Inventors: Abraham Shtrahman, 111 Glenn David Dr., Pittsburgh, PA (US) 15238; Matthew Shtrahman, 6332 Bartlett St., Pittsburgh, PA (US) 15217; Gregory Shtrahman, 208 Ridge Rd., Pittsburgh, PA (US) 15238

( * ) Notice: Subject to any disclaimer, the term of this patent is extended or adjusted under 35 U.S.C. 154(b) by 39 days.

(21) Appl. No.: 09/699,623

(22) Filed: Oct. 30, 2000

(51) Int. Cl.[7] .............................................. C30B 35/00
(52) U.S. Cl. ...................... 117/200; 117/201; 117/202; 117/900; 422/99; 422/100
(58) Field of Search ................................. 117/200, 201, 117/202, 900; 422/99, 100

(56) References Cited

U.S. PATENT DOCUMENTS

| | | |
|---|---|---|
| 4,755,363 A | 7/1988 | Fujita et al. |
| 5,763,278 A | 6/1998 | Sickinger et al. |
| 5,785,926 A | 7/1998 | Scubert et al. |
| 5,873,394 A * | 2/1999 | Meltzer ..................... 141/130 |

FOREIGN PATENT DOCUMENTS

| | | |
|---|---|---|
| EP | 553539 A1 | 4/1993 |
| GB | 2249492 A | 5/1992 |
| WO | WO 93/07311 | 4/1993 |

* cited by examiner

Primary Examiner—Felisa Hiteshew
(74) Attorney, Agent, or Firm—Cohen & Grigsby, P.C.

(57) ABSTRACT

A fully automated, high output robotic station for the crystallization of proteins and other biopolymers via the sitting drop vapor diffusion and micro-batch methods. This station performs microplate feeding, liquid aspiration, dilution, and dispensing, as well as microplate sealing and storage into a temperature controlled hotel. All functions are microprocessor controlled. The operator designs the process via graphical user interface, after which the station executes the process automatically to completion.

16 Claims, 8 Drawing Sheets

APPARATUS AND METHOD OF PREPARATION FOR AUTOMATED HIGH OUTPUT BIOPOLYMER CRYSTALLIZATION VIA VAPOR DIFFUSION SITTING DROP AND MICRO-BATCH TECHNIQUES

FIELD OF THE INVENTION

This present invention relates to an automated robotic station for crystallization of proteins and other biopolymers via the sitting drop vapor diffusion and micro-batch methods.

BACKGROUND OF THE INVENTION

In order to visualize the three dimensional structure of proteins and other biopolymers via x-ray diffraction crystallography, one must grow quality crystals of the biopolymer. Unfortunately, the science of protein crystal growth is currently incapable of predicting the conditions under which a particular protein will crystallize. Thus, as with many combinatorial problems, one must search a high dimensional parameter space (large number of possible recipes) to find the solution (optimal crystallization conditions). Often the brute force approach of preparing and screening many experiments is the most effective method. This is extremely labor-intensive and time consuming. Thus, preparing quality protein crystals remains the bottleneck for elucidating the structure of proteins via x-ray diffraction crystallography. As a result, there has been significant effort to automate this process.

Machines that dilute stock solutions and dispense protein and other ingredients into chambers for crystal growth have been available for some time. Recently, machines have been developed which automate additional steps in the process of protein crystallization. However, despite recent attempts, these machines require several manual steps and are not capable of achieving high output. For example, operators must manually feed empty crystallization plates and remove completed ones. Thus, the process is limited to filling at most a handful of plates without operator intervention. Also, these plates must be removed quickly by the operator to prevent degradation of substrates due to lack of temperature control. In addition, most machines search for crystallization conditions for one protein at a time and only utilize a handful of ingredients simultaneously. Lastly, many of these machines utilize plates with only twenty-four wells, where each well represents a single crystallization experiment. As a result, these machines are capable of producing dozens (not hundreds or thousands) of experiments for a single protein and are limited to exploring a few ingredients. Thus, they are not capable of preparing large numbers of disparate combinations for multiple proteins, which is necessary for effective high output crystal screening.

It would be desirable to develop a machine that can prepare vast numbers (on the order of thousands) of unique crystallization experiments, which contain many combinations of ingredients for multiple proteins, in a realistic time frame and in a fully automated manner. In particular, this machine must be capable of automatic feeding of many plates (of various capacities including 24, 96, and potentially 384 wells) individually, dispensing small volumes of solutions accurately, sealing crystallization experiments, and storing completed plates in a temperature controlled environment. This process should be accomplished completely under microprocessor control, based on recipes custom designed by the operator via special software. Lastly, this machine should be able to interface with future intelligent systems that quantitatively asses crystallization experiments and modify the design of future experiments.

SUMMARY OF THE INVENTION

The object of the present invention is to provide a fully automated high output robotic station for the crystallization of proteins and other biopolymers via the sitting drop vapor diffusion method and microbatch technique.

This is a table mounted robotic station capable of preparing crystallization experiments specified by the operator via software. The entire process is fully automated, from the loading of the empty microplates from the magazine, to the storage of the completed microplates in a temperature controlled hotel. The magazine and hotel are capable of holding approximately thirty 96-well (as well as 24-well and potentially 384-well) microplates, thus allowing the user to carry out approximately 3,000 experiments in a single cycle.

The station utilizes the following components: a mechanism for automatic loading and positioning of microplates; a fluid dispensing system that includes reagent bottles, fluid transport lines, and a probe(s) for the delivery and pipetting of small volumes of protein and ingredients; a system that seals the crystallization experiments with tape; and a hotel for storing completed microplates in a temperature controlled environment.

The accompanying drawings in conjunction with the detailed descriptions will provide further evidence of this machine's advantage over existing technology.

Other advantages of the invention will become apparent from a perusal of the following detailed description of a presently preferred embodiment of the invention taken in connection with the accompanying drawings.

DETAILED DESCRIPTION OF THE PRESENTLY PREFERRED EMBODIMENT

As described above, the present invention relates to a fully automated robotic station for preparing protein crystallization experiments via the sitting drop vapor diffusion and microbatch techniques. The workstation is composed of a stand-alone frame with a flat top plate, to which all components are mounted. The control system and the reagents, are located within the frame.

Figure 1:
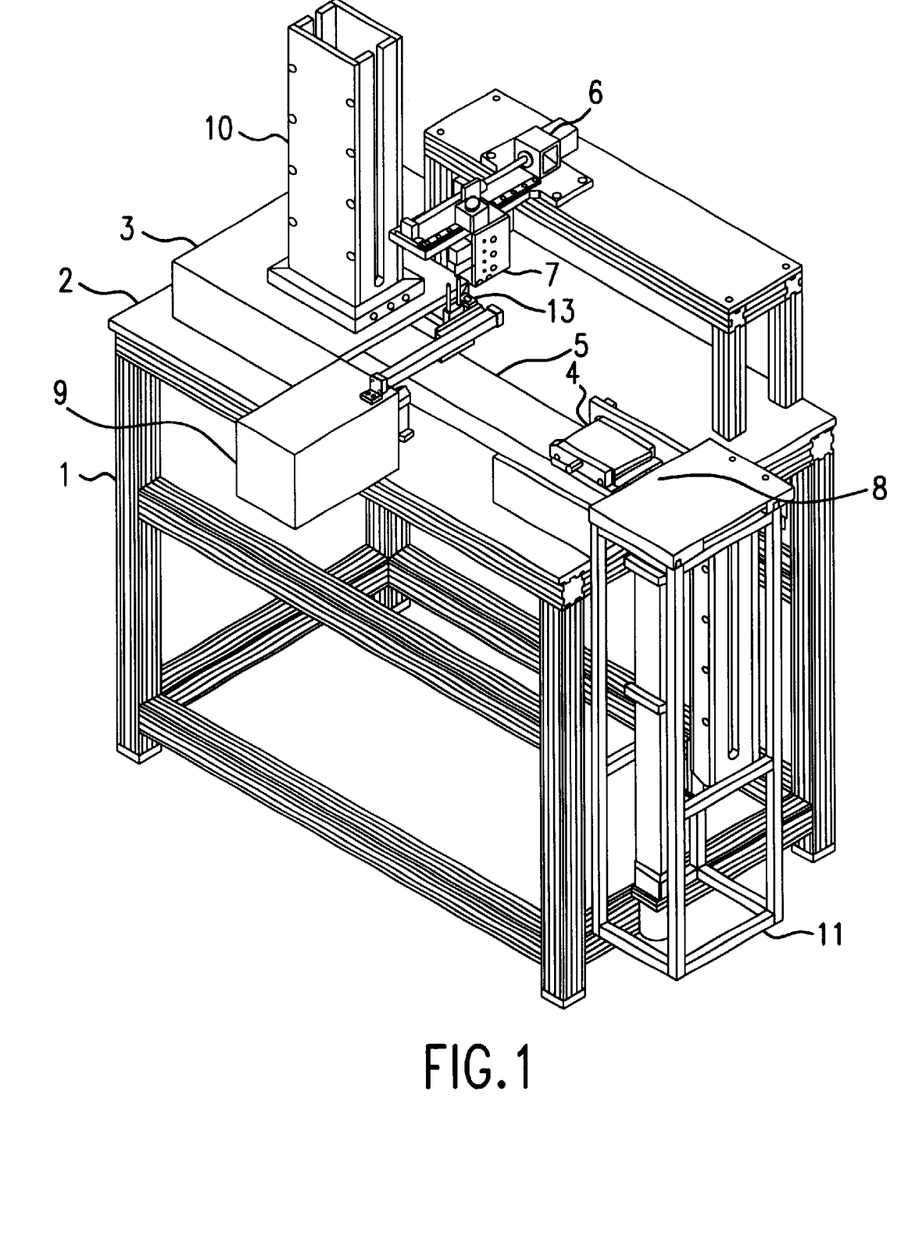
FIG. 1 depicts a diagram of the robotic station for protein crystallization.
Figure 2:
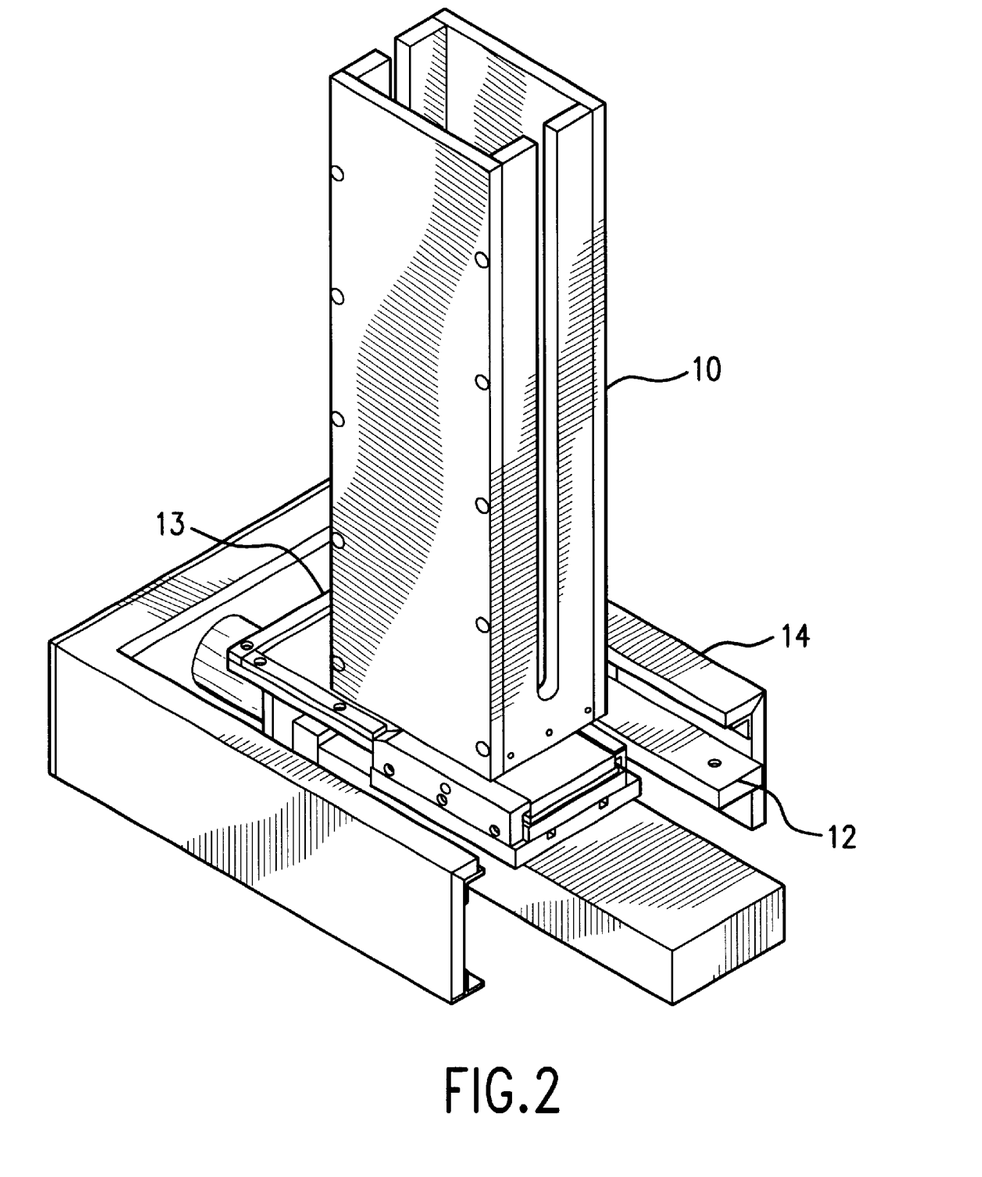
FIG. 2 depicts the magazine for storing microplates and the singulation gate.

FIG. 1 depicts a diagram of the robotic station consisting of the frame 1, table top 2, magazine 10 and singulating gate device 13. As shown in FIG.2, the latter feeds microplates one at a time into the nest assembly 14, which is moved by either a stepper or servo driven slide 5. This movement of the nest 14 allows for placing of the microplate into the dispensing and unloading positions. A separate positioning mechanism 6 moves the probe assembly 7 into the proper location for dispensing of fluid into specific wells and reservoirs. The microplate removing mechanism 8 moves filled and sealed microplates into the stacking device or "hotel" 11. The sealing device 9 covers a subset (usually one row) of reservoirs and wells with tape to prevent evaporation.

FIG. 2 depicts a magazine 10 and a singulating gate 13. This device retrieves empty microplates stored in the magazine 10 that is mounted on a cover, which opens allowing microplate to drop into the nest 14. The singulating gate 13, which is mounted on a spring loaded ball slide 12, prevents additional microplates from entering the nest 14.

Figure 3:
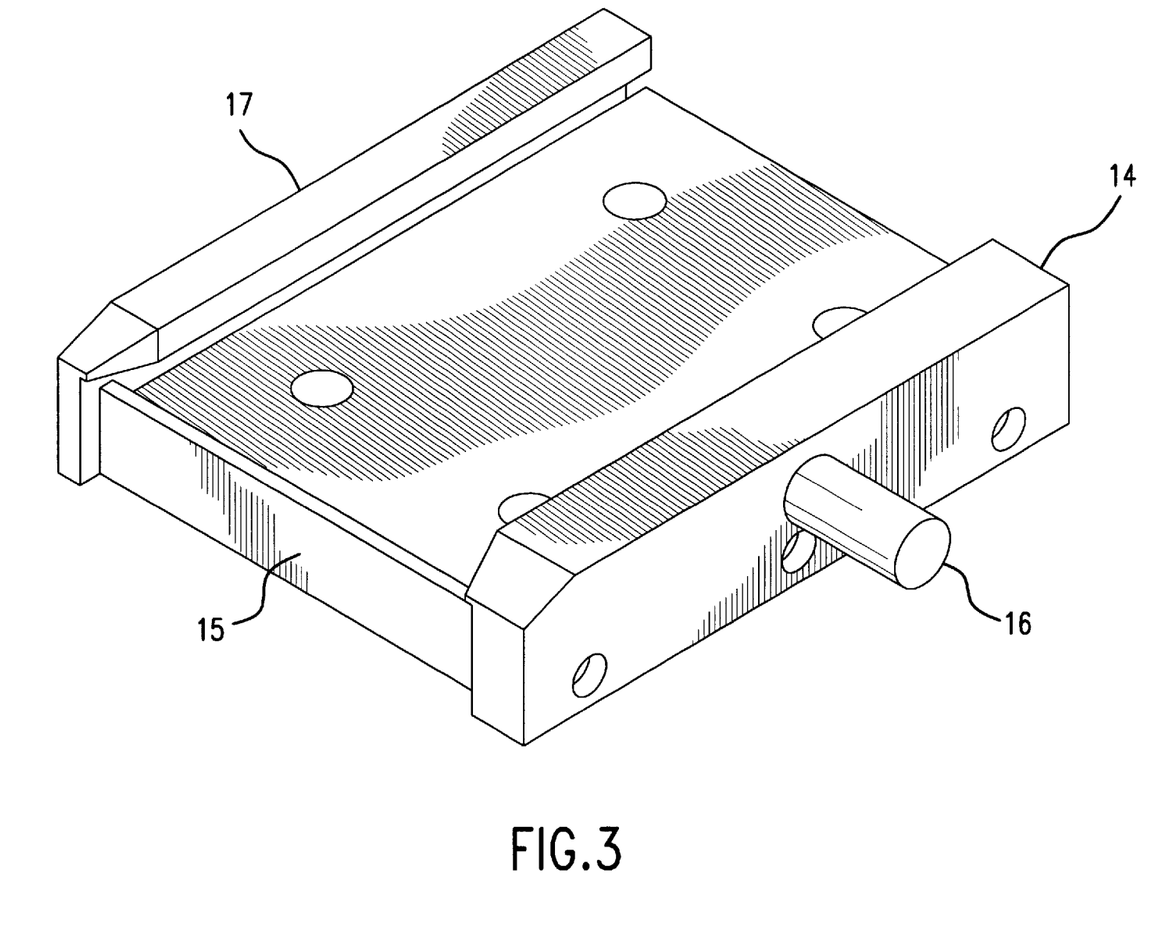
FIG. 3 depicts the nest and sliding mechanism that hold and manipulate the microplate.

FIG. 3 depicts a nest 14 consisting of a lip 15 and a solenoid 16 that hold the microplate against a reference guide 17, assuring a consistent reference point for the probe 20. The nest 14 is mounted to a stepper or servo motor driven slide 5. In the case of a stepper motor driven system, the motor is equipped with a differential encoder to ensure accuracy.

Figure 4:
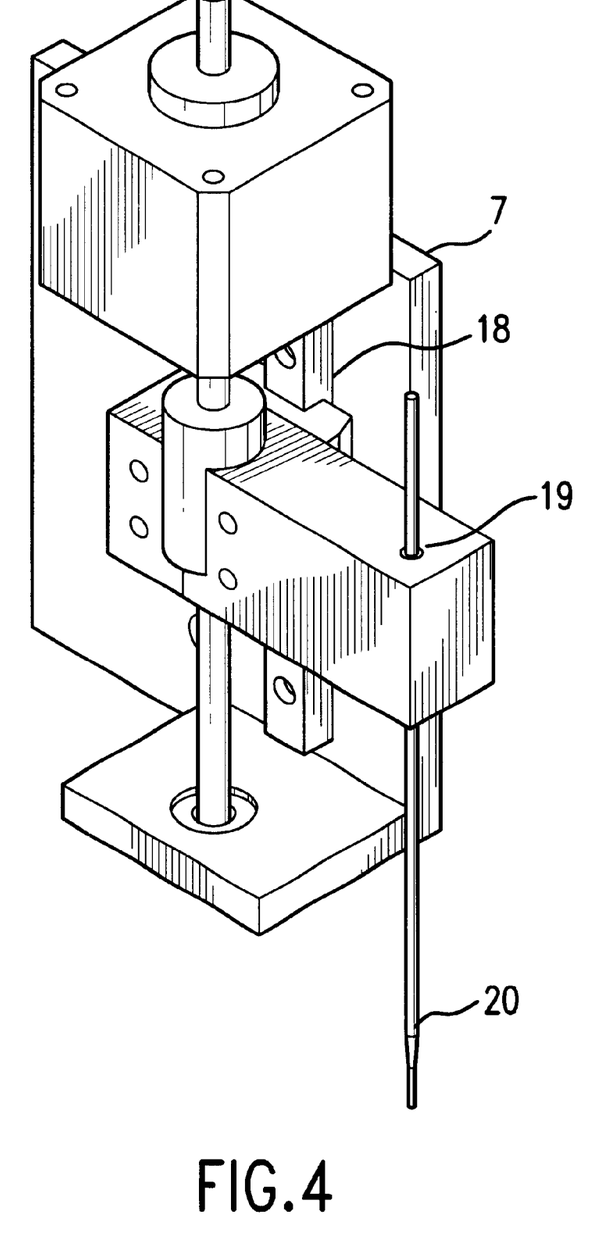
FIG. 4 depicts the probe holding device.

FIG. 4 depicts the device for holding the probe 20. This device consists of a probe holder 7 that secures the probe 20 via an insulated bushing 19 and guides 18, which are pressed into the probe holder 7.

Figure 5:
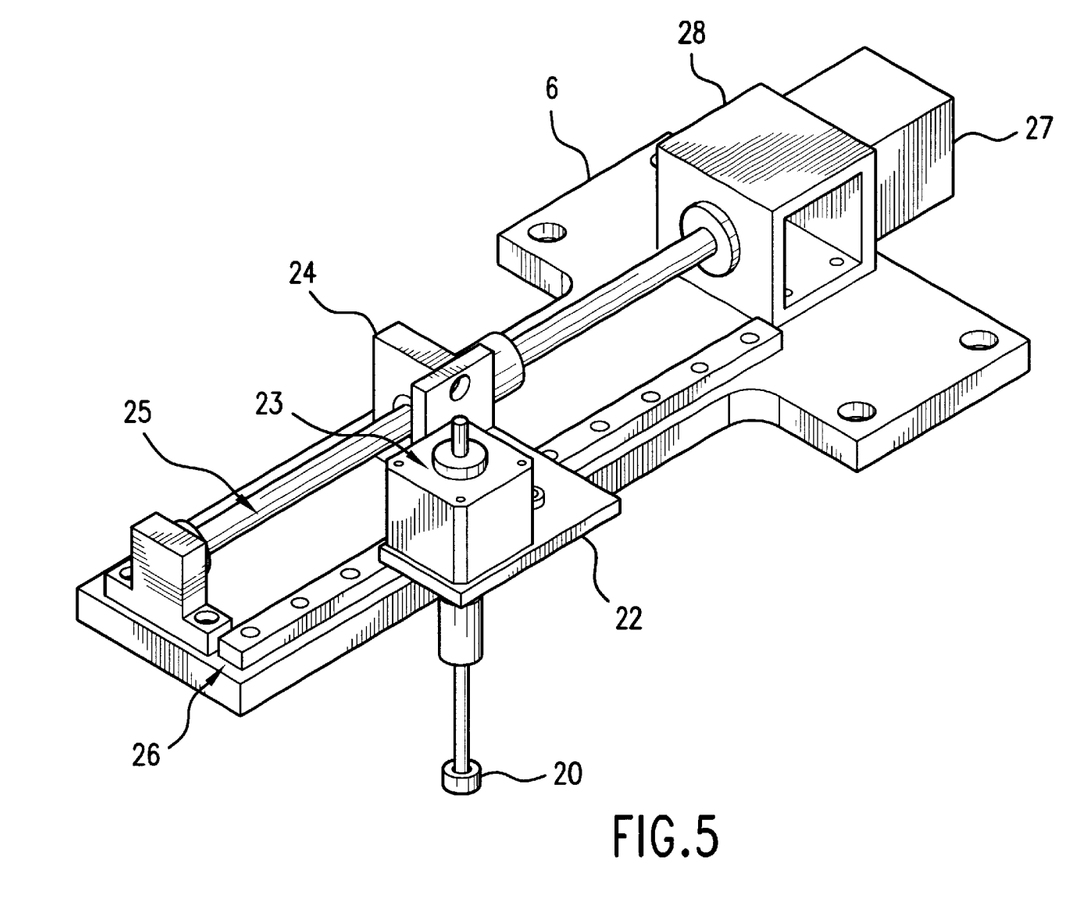
FIG. 5 depicts the head bracket with the mechanism for moving probe in YZ directions.

FIG. 5 depicts the positioning mechanism device 6, consisting of head bracket 22, which contains a stepper or servo motor lead screw actuator 23, for moving the probe 20 in the Z (vertical) direction. The head bracket 22 is connected to the backlash free nut 24, moved by precision lead screw 25, and guided by linear guide 26. The precision lead screw 25 moves the probe 20 in the Y direction via a stepper or servo motor 27, while support is supplied by the bearing block 28.

Figure 6:
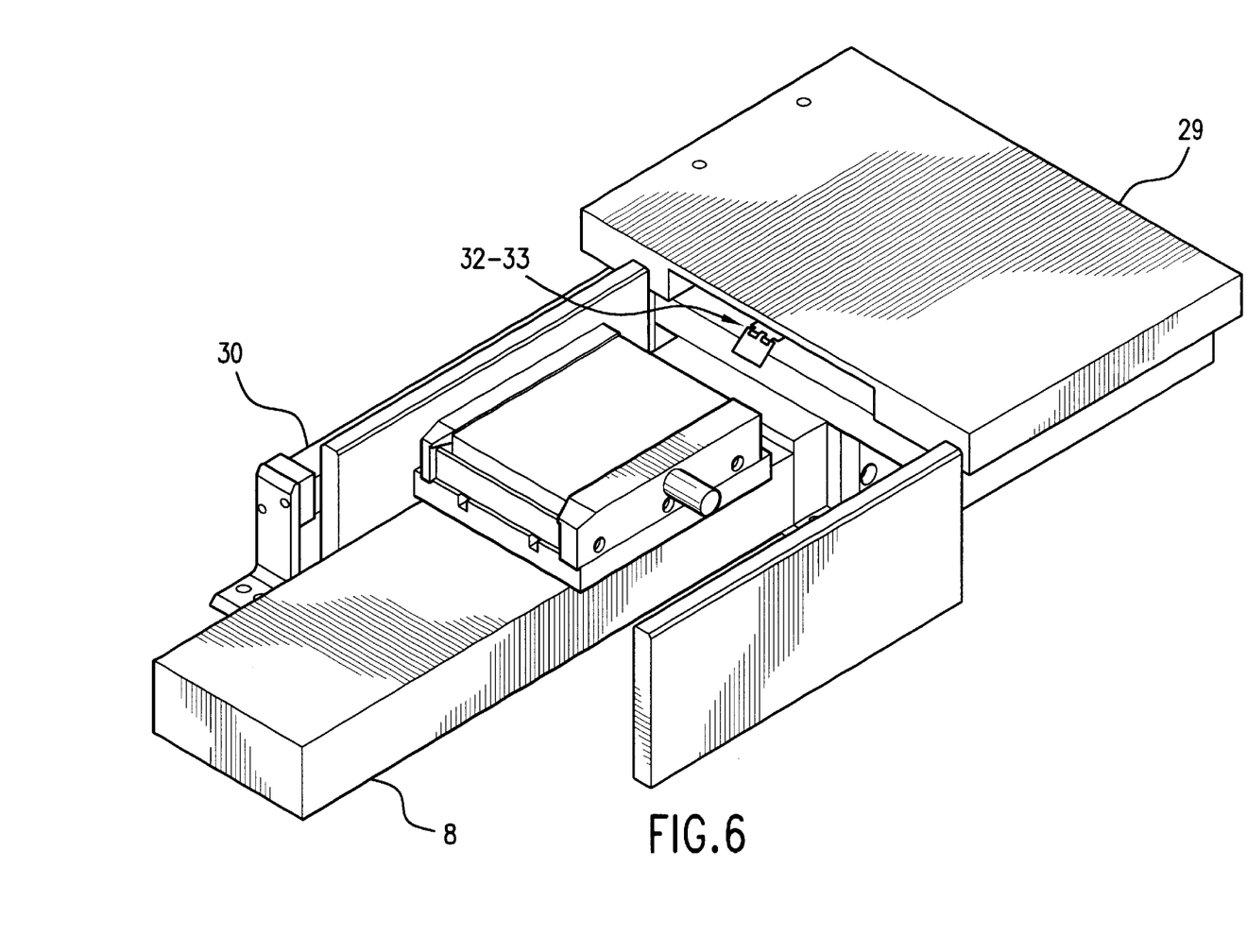
FIG. 6 depicts the mechanism for removing completed microplates.

FIG. 6 depicts the microplate removing device 8 with cover 29, which is activated by a rodless air cylinder 30. The cover 29 runs on two supports 31 and has a swinging hook 32. The hook 32 is activated by a spring 33 (or air cylinder 33). When engaged, the hook will grab a microplate, along with cover 29, and move the microplate into the hotel 11.

Figure 7:
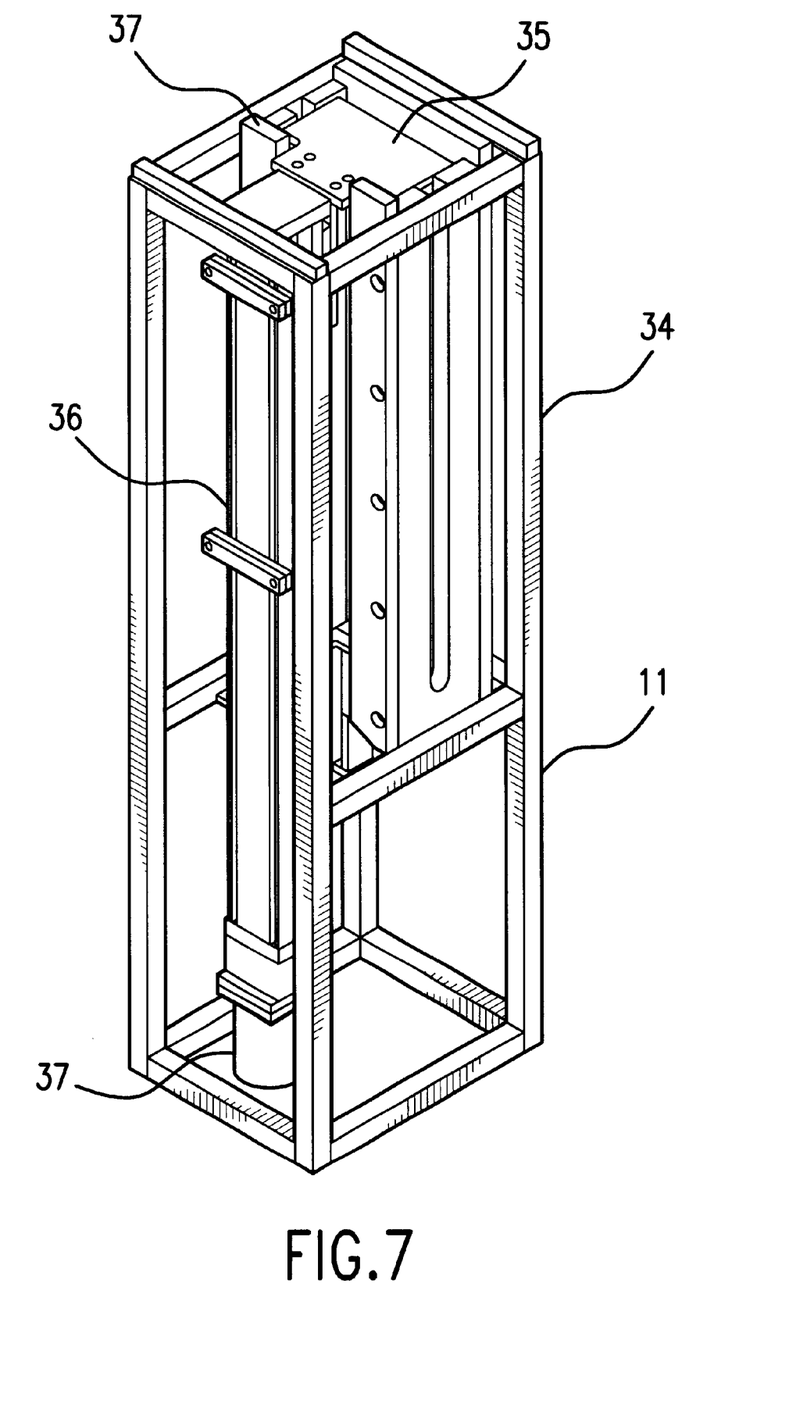
FIG. 7 depicts the mechanism for stacking completed microplates.

FIG. 7 depicts a microplate stacking device, or "hotel" 11 consisting of an external enclosure 34 and a stacking plate 35. The stacking plate 35 is mounted on a vertical slide 36, and moves via stepper or servo motor 37. The device indexes in vertical steps equivalent to the height of one microplate in order to accommodate incoming completed and sealed microplates. When the hotel is full the entire stack of microplates can be removed manually with container 37.

Figure 8:
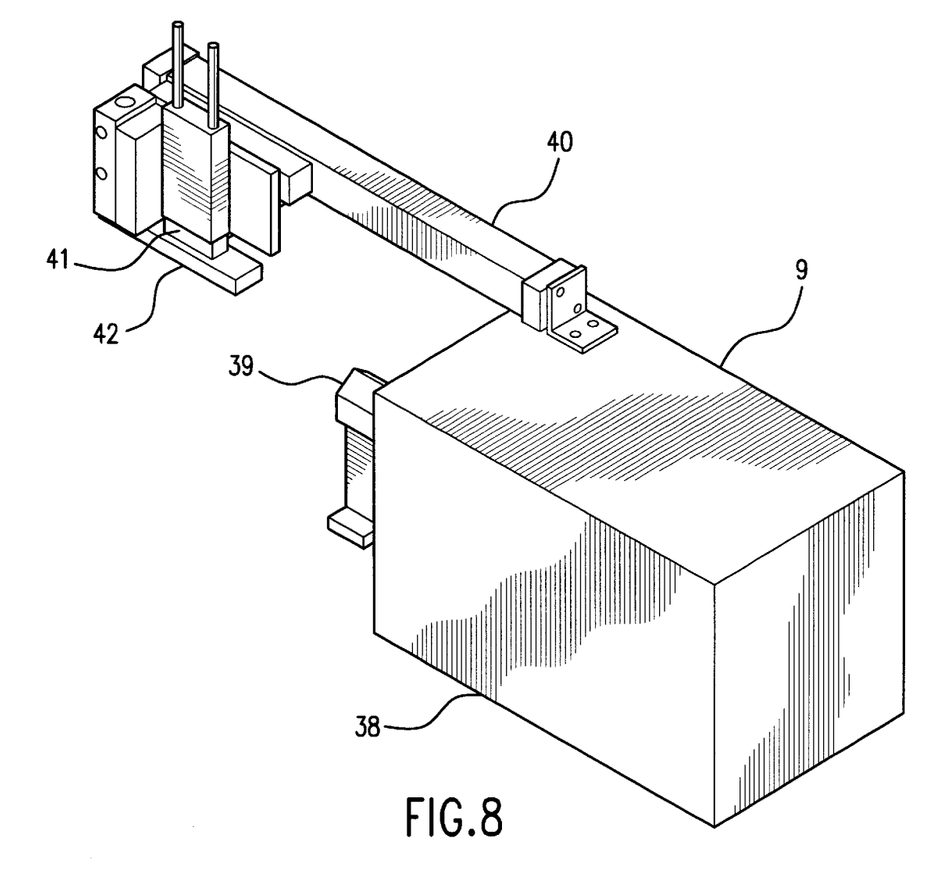
FIG. 8 depicts the microplate sealing mechanism for application of tape.

FIG. 8 depicts a microplate sealing mechanism 9 consisting of a tape dispenser 38, anvil 39, horizontal air activated slide 40, air activated vertical slide 41, and vacuum gripper 42. The dispenser mechanism 38 will dispense individual pieces of tape onto the anvil 39, whereby the vacuum gripper 42 will move via slides 40 and 41 to the anvil 39 to receive the tape, and then back to the microplate to dispense the tape. The vacuum gripper 42 then moves the tape over the microplate via slides 40 and 41 and applies it to the surface, thus sealing the reservoirs and wells.

While the invention has been described in connection with what is presently considered to be the preferred embodiment, it is to be understood the invention is not to be limited to the disclosed embodiments, but on the contrary is intended to cover various modifications and equivalent arrangements include within the spirit of the scope of the appended claims.

What is claimed is:

1. A robotic station for protein crystallization comprising:
   (a) a magazine storing at least one empty microplate,
   (b) said microplate being comprised of an array of wells paired with reservoirs;
   (c) a nest that holds the microplate in position and indexes via an electrically or mechanically driven mechanism;
   (d) a mechanism for feeding a microplate into said nest;
   (e) a liquid dispensing system with at least one probe, each said probe containing at least one bore that delivers specified volumes into specific wells and reservoirs of said microplate;
   (f) an electrically or mechanically driven system that positions said probe over targeted reservoirs and wells;
   (g) a sealing mechanism that transfers a seal from a dispenser onto selected wells and reservoirs to seal them from the environment;
   (h) an incubator for storing the microplates in a controlled environment;
   (i) a microplate removing mechanism that removes a microplate from the nest and places it in said incubator;
   (j) a stacking mechanism that stacks the microplates inside said incubator.

2. A robotic station for protein crystallization as claimed in claim 1, wherein said mechanism for feeding said microplate into the nest comprises a wedge operated spring gate that automatically opens to feed said microplate by moving the nest via stepper or servo motor driven slide.

3. A robotic station for protein crystallization as claimed in claim 1, further comprised of a table on which the robotic station and its components are mounted.

4. A robotic station for protein crystallization as claimed in claim 3, wherein said table is further comprised of a cabinet that contains multiple reagent bottles and their ingredients along with a temperature controlled bottle for the biopolymer to be crystallized as well as a bottle for waste solutions.

5. A robotic station for protein crystallization as claimed in claim 4, wherein said liquid dispensing system comprises fluid transport lines and valves connecting the reagent bottles with said probes and further comprises a probe washing and drying station.

6. A robotic station for protein crystallization as claimed in claim 5, wherein said liquid dispensing system further comprises a vacuum source for automatically aspirating fluids into said fluid transport lines and further comprises sources for nitrogen gas or compressed air for automatically drying the lines.

7. A robotic station for protein crystallization as claimed in claim 1, further comprising stepper or servo motor driven mechanism to direct the probe in three dimensions over said targeted wells and reservoirs of the microplate.

8. A robotic station for protein crystallization as claimed in claim 1, wherein said sealing mechanism automatically dispenses tape and places it over said wells and reservoirs via a vacuum gripper driven by air activated slides.

9. A robotic station for protein crystallization as claimed in claim 1, wherein said microplate removing mechanism automatically slides the filled and sealed microplate into said incubator on guides by means of an air driven actuator and a spring operator.

10. A robotic station for protein crystallization as claimed in claim 1, wherein said stacking mechanism automatically indexes via stepper or servo motor to accommodate an incoming microplate.

11. A robotic station for protein crystallization as claimed in claim 1, wherein said incubator comprises a microplate carrying container which allows simultaneous removal of completed microplates.

12. A robotic station for protein crystallization as claimed in claim 1, wherein said feeding, indexing, dispensing, sealing, removing, stacking and storing of the microplate are computer controlled.

13. A robotic station for protein crystallization as claimed in claim 1, wherein said liquid dispensing system is computer controlled.

14. A robotic station for protein crystallization as claimed in claim 1, wherein said manipulation, dispensing, and application of said seal is computer controlled.

15. A method of preparing microplates for vapor diffusion crystallization via sitting drop method, comprising of the following steps:

(a) feeding a microplate from a magazine into a nest;

(b) reading the code of the microplate;

(c) indexing the nest into proper position to allow selected wells and reservoirs of the microplate to be injected with ingredients via the transport of fluid through transport lines into a probe for dispensing said fluid;

(d) flushing the fluid transport lines and drying them;

(e) washing and drying the probe(s);

(f) positioning the probe(s) over a subset of reservoirs for dispensing specified reagent;

(g) repetitive dispensing and flushing of reagents and washing and drying of lines and probe(s) until said subset of reservoirs contain all necessary ingredients;

(h) loading probe(s) with a biopolymer to be crystallized;

(i) positioning of probe(s) over the wells corresponding to the said subset of reservoirs and dispensing solution that contains the biopolymer to be crystallized;

(j) alternating washing and drying with positioning of probe(s) over each reservoir of said subset and dispensing a small portion of the contents of said reservoir into a corresponding well;

(k) sealing said subset of wells and reservoirs;

(l) repetitive dispensing of ingredients into subsequent subsets of reservoirs and wells and flushing and drying of lines and probe(s) and sealing said reservoirs and wells until said microplate is completely full and covered;

(m) removing said completed microplate from the nest and loading said microplate into an incubator;

(n) indexing said incubator to accommodate next microplate;

(o) repeating all previous steps until all microplates are completed.

16. A method of preparing microplates using a multibore probe and the micro-batch crystallization technique, comprising the following steps:

(a) feeding a microplate from a magazine to a nest;

(b) reading the microplate code;

(c) indexing the nest into proper position to allow the reservoirs of the microplate to be filled with ingredients via the transport of fluid through transport lines into said probe for dispensing said fluid into said microplate;

(d) flushing the fluid transport lines with water and drying them with nitrogen gas or compressed air;

(e) washing and drying the probe;

(f) positioning the probe over a subset of reservoirs that are computer selected and dispensing paraffin oil into each of them;

(g) loading each bore of the multibore probe with a solution comprising one ingredient or biopolymer;

(h) positioning the probe into an oil filled reservoir and dispensing a specified volume of solution;

(i) retracting the probe from the oil;

(j) repeating said positioning, dispensing, and retraction until all reservoirs of said subset that contain the same combination of ingredients are completed;

(k) repetitive dispensing and flushing of reagents and flushing and drying of lines and probe until said subset of reservoirs contain all necessary ingredients;

(l) feeding tape from a dispenser, cutting it, and placing it over said subset of wells and reservoirs;

(m) repetitive dispensing of ingredients into subsequent subsets of reservoirs and wells and flushing and drying of the lines and the probe and sealing of reservoirs and wells with tape until said microplate is completely full and covered;

(n) removing the completed microplate from said nest and loading said microplate into an incubator;

(o) indexing said hotel downward to accommodate the next microplate;

(p) repeating all previous steps until all microplates are completed.

* * * * *